(12) United States Patent  
Ranganath et al.

(10) Patent No.: US 7,098,471 B2
(45) Date of Patent: Aug. 29, 2006

(54) SEMICONDUCTOR QUANTUM WELL DEVICES AND METHODS OF MAKING THE SAME

(75) Inventors: Tirumala R. Ranganath, Palo Alto, CA (US); Jintian Zhu, Palo Alto, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 64 days.

(21) Appl. No.: 10/867,037

(22) Filed: Jun. 14, 2004

(65) Prior Publication Data

US 2005/0274941 A1 Dec. 15, 2005

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)

(52) U.S. Cl. .............. 257/14; 257/9; 257/15; 257/16; 257/17; 257/18; 257/19; 257/20; 257/21; 257/22; 257/23; 257/24; 257/25; 438/172; 438/761

(58) Field of Classification Search .......... 257/9, 257/14–25; 438/172, 761
See application file for complete search history.

(56) References Cited

U.S. PATENT DOCUMENTS

| 5,081,634 A | * | 1/1992 | Weisbuch et al. ........ 372/45.01 |
| 5,090,790 A | | 2/1992 | Zucker |
| 5,412,225 A | | 5/1995 | Dutta et al. |
| 5,625,635 A | * | 4/1997 | Kurtz et al. ........... 372/45.011 |
| 5,747,827 A | * | 5/1998 | Duggan et al. ............... 257/15 |
| 5,757,023 A | | 5/1998 | Koteles et al. |
| 5,848,085 A | | 12/1998 | Nitta |
| 6,075,254 A | * | 6/2000 | Shen et al. ................... 257/21 |
| 6,437,361 B1 | | 8/2002 | Matsuda |
| 6,476,596 B1 | * | 11/2002 | Wraback et al. ......... 324/158.1 |
| 6,526,075 B1 | * | 2/2003 | Mizutani ..................... 372/27 |
| 6,574,027 B1 | | 6/2003 | Miyazaki |
| 2003/0057415 A1 | * | 3/2003 | Komori ....................... 257/13 |
| 2003/0235224 A1 | * | 12/2003 | Ohlander ..................... 372/46 |
| 2004/0124409 A1 | * | 7/2004 | Ebe et al. .................... 257/14 |
| 2004/0149981 A1 | * | 8/2004 | Reynolds ..................... 257/14 |
| 2004/0240025 A1 | * | 12/2004 | Bour et al. ................. 359/241 |
| 2006/0025835 A1 | * | 2/2006 | Calcott ....................... 607/86 |

* cited by examiner

*Primary Examiner*—Ida M. Soward

(57) ABSTRACT

Semiconductor quantum well devices and methods of making the same are described. In one aspect, a device includes a quantum well structure that includes semiconductor layers defining interleaved heavy-hole and light-hole valance band quantum wells. Each of the quantum wells includes a quantum well layer interposed between barrier layers. One of the semiconductor layers that functions as a barrier layer of one of the light-hole quantum wells also functions as the quantum well layer of one of the heavy-hole quantum wells. Another of the semiconductor layers that functions as a barrier layer of one of the heavy-hole quantum wells also functions as the quantum well layer of one of the light-hole quantum wells.

21 Claims, 5 Drawing Sheets

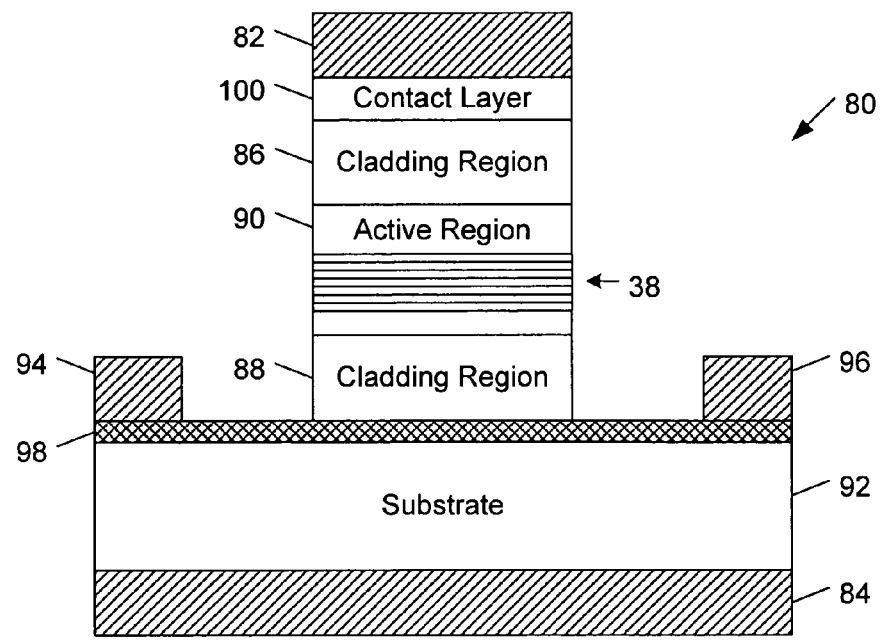
FIG. 4
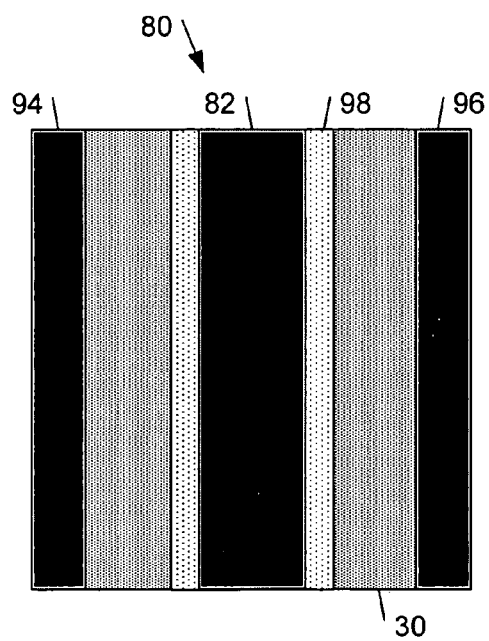 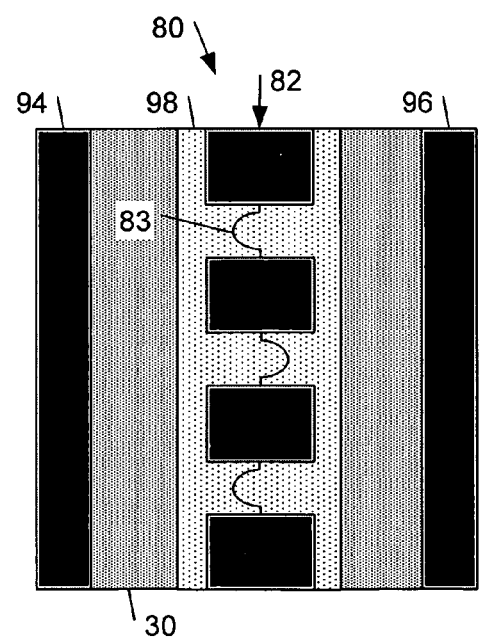
FIG. 5A          FIG. 5B

SEMICONDUCTOR QUANTUM WELL DEVICES AND METHODS OF MAKING THE SAME

BACKGROUND

A quantum well typically is made by forming a narrow bandgap semiconductor layer between two wide bandgap semiconductor layers. The narrow bandgap semiconductor layer is referred to as the quantum well layer and the wide bandgap semiconductor layers are referred to as barrier layers. Multiple quantum wells may be formed from an alternating series of narrow bandgap semiconductor layers and wide bandgap semiconductor layers.

Quantum well structures have been incorporated into a wide range of optoelectronic devices, including EAMs (Electro-Absorption Modulators), EMLs (Electro-absorption Modulated Lasers), detectors, wave-guides, inline optical amplifiers, as well as integrated structures that use a combination of these devices.

Polarization independence is a desirable feature for many types of optoelectronic devices. The quantum confinement in semiconductor quantum well devices, however, lifts the degeneracy of the heavy-hole and light-hole valence bands. In unstrained semiconductor material, the heavy-hole ground state is lower in energy than the corresponding light-hole ground state. The resulting differences in the bound state energies for light-holes and heavy holes causes the light holes and the heavy holes to couple differently to electromagnetic waves. For example, TE (transverse electric) mode light couples conduction band electrons with the heavy-hole valence band, whereas TM (transverse magnetic) mode light couples conduction band electrons with the light-hole valence band. Depending on the semiconductor materials and the type of strain, one of the light-hole or heavy-hole valence bands is shifted to a higher energy level while the other valence band is shifted to a lower energy level. Therefore, in many semiconductor quantum well devices the bandgap energy, which determines the optoelectronic properties of the device, is a function of the polarization of light traveling through a quantum well structure.

Different types of polarization-independent semiconductor quantum well devices have been proposed. In one approach, a slight tensile strain is introduced in the quantum wells to move the transition energies for light holes and heavy holes to the same energy level. In this way, the wave-guide dispersion for TE and TM polarizations may be made small enough to achieve polarization independence. Another approach has used a combination of two groups of quantum wells that are interspersed in a single active region and are suitably configured such that one group of quantum wells provides TE mode optical coupling and the second set of quantum wells provides TM mode optical coupling. In this approach, the waveguide dispersion for TE and TM polarizations is substantially reduced by configuring the two quantum well groups (one set for TE and a second set for TM) so that the level of TE mode optical coupling is approximately the same as the level of TM mode optical coupling.

In each of the above-described approaches for achieving polarization-independent operation, all of the electron-hole transitions occur within the quantum wells. Because of the conservation of the oscillator strength/matrix element, the available oscillator strength in the slightly tensile strained quantum well active structure is split equally between TM-mode coupling and TE-mode coupling. Hence the level of optical absorption available for a given polarization is roughly one-half of what it would be if the device were designed for a single type of polarization. For the case with two separate groups of quantum wells (one set for TE and the other set for TM polarization), a relatively thicker (e.g., twice as thick) quantum well active region is needed to achieve the same level of coupling for each polarization mode as a device designed for a single type of polarization, but this is not always feasible. In this approach, the waveguide effectively has been diluted by including quantum wells for both polarizations. Complications such as carrier transport problems as well as output coupling problems due to the stronger optical confinement also may arise in this approach.

SUMMARY

The invention features semiconductor quantum well devices and methods of making the same.

In one aspect of the invention, a device includes a quantum well structure that includes semiconductor layers defining interleaved heavy-hole and light-hole valance band quantum wells. Each of the quantum wells includes a quantum well layer interposed between barrier layers. One of the semiconductor layers that functions as a barrier layer of one of the light-hole quantum wells also functions as the quantum well layer of one of the heavy-hole quantum wells. Another of the semiconductor layers that functions as a barrier layer of one of the heavy-hole quantum wells also functions as the quantum well layer of one of the light-hole quantum wells.

The invention also features a method of making the above-described device.

Other features and advantages of the invention will become apparent from the following description, including the drawings and the claims.

DESCRIPTION OF DRAWINGS

FIG. 4 is a diagrammatic view of an embodiment of an electroabsorption modulator that incorporates the embodiment of the semiconductor quantum well structure shown in FIG. 2.

FIG. 5A is a top view of an implementation of the electroabsorption modulator embodiment of FIG. 4 that has a signal electrode formed from a continuous strip of electrically conductive material.

FIG. 5B is a top view of an implementation of the electroabsorption modulator embodiment of FIG. 4 that has a signal electrode formed from multiple spaced-apart electrode segments of electrically conductive material that are connected in series by inter-stage microstrip lines.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

The semiconductor quantum well structures described herein are configured so that some semiconductor layers function as a quantum well layer for one type of hole and as a barrier layer for another type of hole. By interleaving such semiconductor layers, bound quantum well states may be created in a series of adjacent semiconductor layers, each of which may contribute to optical absorption for the two different input polarizations of the incident light. In some implementations, the bound quantum well states are at approximately the same energy level so that the level of optical coupling to heavy-hole states is approximately the same as the level of optical coupling to the light-hole states. In this way, these semiconductor quantum well structures provide substantially polarization-independent operation. Relative to other polarization-independent optoelectronic device designs, the embodiments described herein provide twice the optical coupling (e.g., absorption or gain) for a given interaction length and a given number of quantum wells. Therefore, the embodiments described herein may be fabricated with an interaction length that is one-half of the interaction lengths of other polarization-independent designs, while providing comparable polarization-independent performance.

Figure 1A:
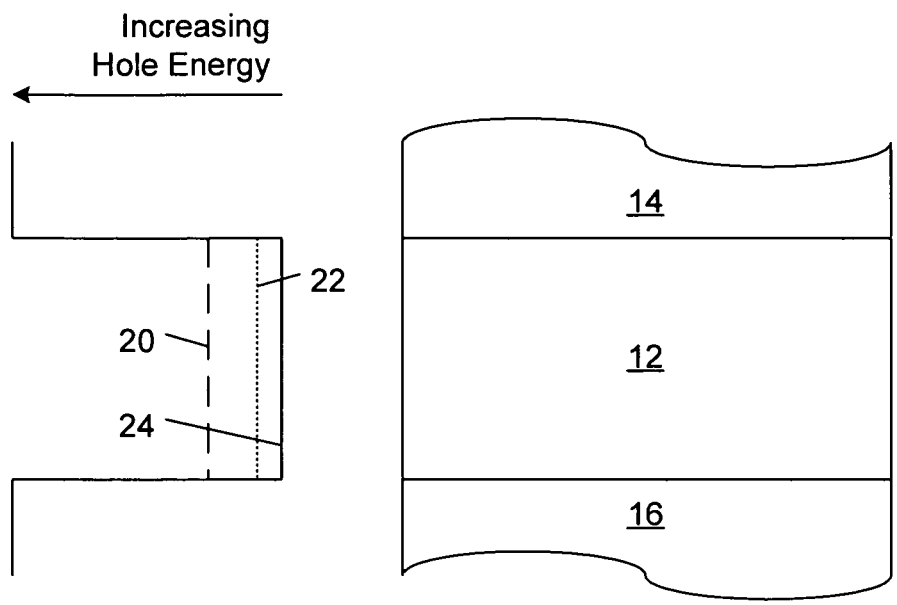
FIG. 1A is a diagrammatic view of a prior art semiconductor quantum well structure and an associated energy-band diagram for a hole quantum well formed in an unstrained semiconductor quantum well layer.
Figure 1B:
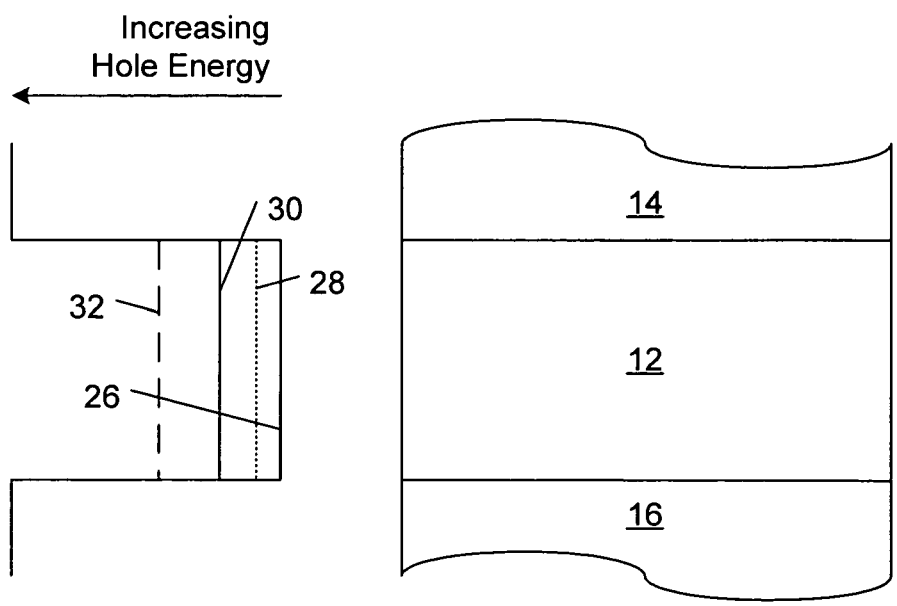
FIG. 1B is a diagrammatic view of a prior art semiconductor quantum well structure and an associated energy-band diagram for a hole quantum well formed in a semiconductor quantum well layer under compressive strain.
Figure 1C:
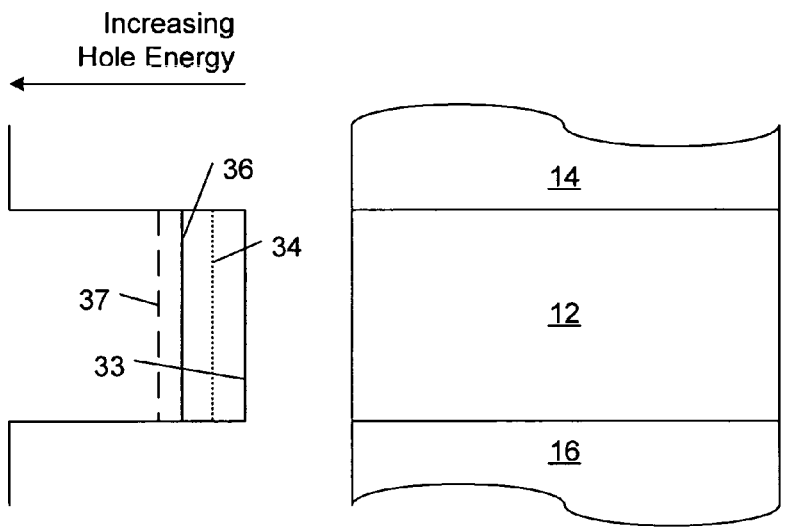
FIG. 1C is a diagrammatic view of a prior art semiconductor quantum well structure and an associated energy-band diagram for a hole quantum well formed in a semiconductor quantum well layer under tensile strain.

FIGS. 1A, 1B, and 1C show the effects of strain on the first bound quantum well states (or levels) for light-holes and heavy-holes. In FIG. 1A, a valence-band quantum well is formed in an unstrained semiconductor quantum layer 12 that is interposed between a pair of semiconductor barrier layers 14, 16. When the semiconductor quantum well layer 12 is unstrained, the first bound quantum well states 20, 22 for light holes and heavy holes are separated in energy as a result of the difference in their respective effective masses. When the quantum well layer 12 is unstrained, the valence band edge 24 for heavy holes and light holes is nominally the same. In FIG. 1B, the semiconductor quantum well layer 12 is under compressive strain. As a result of the compressive strain, the heavy-hole valence band edge 26 and the first heavy hole quantum well state 28 shift to lower energy levels, whereas the light hole valence band edge 30 and the first light hole quantum well state 32 shift to higher energy levels. In FIG. 1C, the semiconductor quantum layer 12 is under tensile strain. As a result of the tensile strain, the light-hole valence band edge 33 and the first light-hole quantum well state 34 shift to lower energy levels, whereas the heavy-hole valence band edge 36 and the first heavy-hole quantum well state 37 shift to higher energy levels.

Thus, the level of strain in semiconductor quantum well layers may be varied to achieve desired energy levels for bound light-hole states and bound heavy-hole states. This principle is used in the design of the semiconductor quantum well structures described in detail below.

Figure 2:
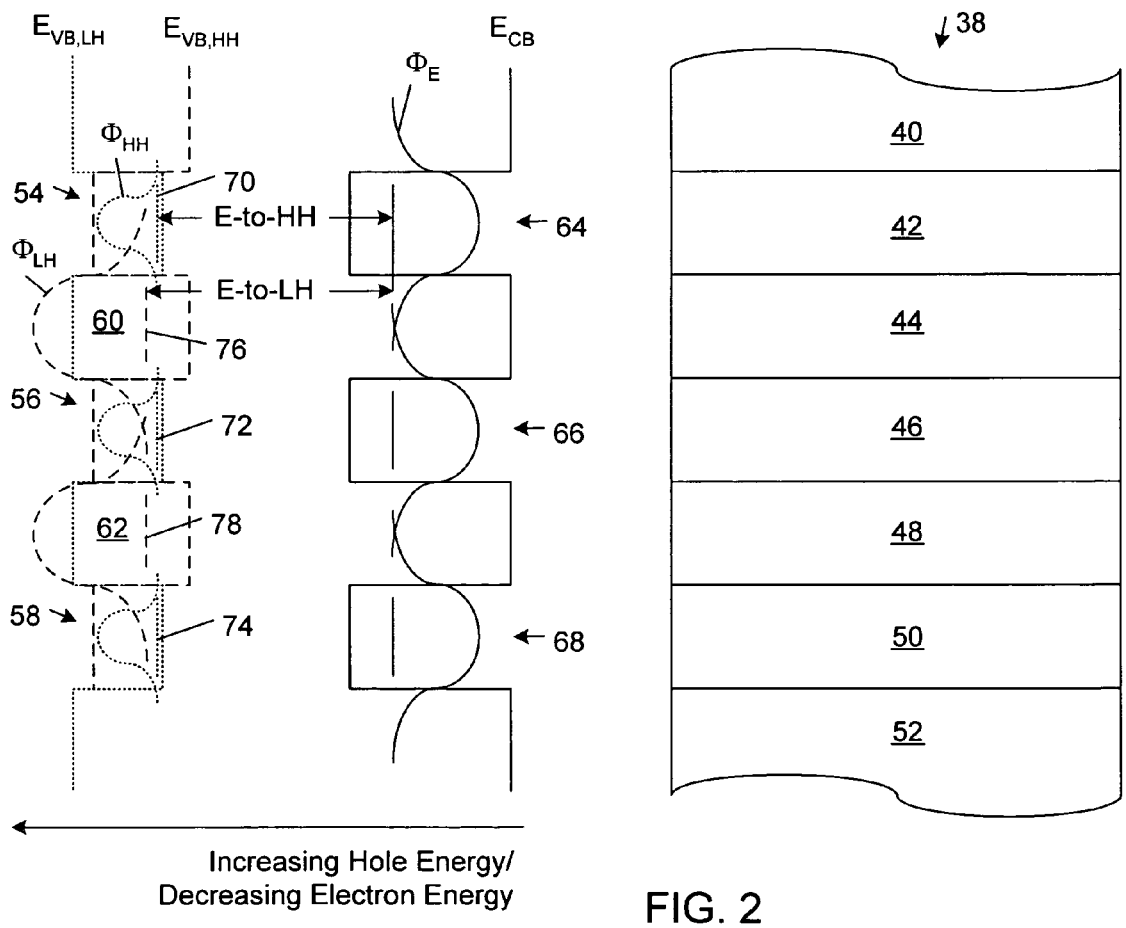
FIG. 2 is a diagrammatic view of an embodiment of a semiconductor quantum well structure that has a series of semiconductor layers functioning as barrier layers and quantum well layers for interleaved heavy-hole and light-hole valence-band quantum wells, and an associated energy-band diagram.

FIG. 2 shows an embodiment of a semiconductor quantum well structure 38 that includes a series of semiconductor layers 40, 42, 44, 46, 48, 50, 52 that function as barrier layers and quantum well layers for a set of heavy-hole valence-band quantum wells 54, 56, 58 (shown by the dotted line in FIG. 2) and light-hole valence-band quantum wells 60, 62 (shown by the dashed line in FIG. 2). The heavy-hole valence-band quantum wells 54, 56, 58 are interleaved with the light-hole valence-band quantum wells 60, 62. In general, the number of heavy-hole quantum wells and the number of light-hole quantum wells in the semiconductor quantum well structure 38 may be the same or different. In the exemplary embodiment shown in FIG. 2, the semiconductor quantum well structure 38 has three heavy-hole quantum wells 54–58 and two light-hole quantum wells 60–62.

In the embodiment of FIG. 2, each quantum well 54–62 includes a layer that functions as a quantum well layer and is interposed between layers that function as barrier layers. For example, with respect to heavy-hole quantum wells 54, 56, 58, semiconductor layers 42, 46, 50 function as quantum well layers and semiconductor layers 40, 44, 48, 52 function as barrier layers. With respect to light-hole quantum wells 60, 62, on the other hand, semiconductor layers 42, 46, 50 function as barrier layers and semiconductor layers 44, 48 function as quantum well layers. Thus, a layer functioning as a barrier layer of a light-hole quantum well also may function as a quantum well layer of a heavy-hole quantum well. Similarly, and a layer functioning as a barrier layer of the heavy-hole quantum well also may function as a quantum well layer of the light-hole quantum well.

Layers 40–52 of the semiconductor quantum well structure 38 additionally function as barrier layers and quantum well layers for a set of conduction-band quantum wells 64, 66, 68. In general, the electron quantum well layers may correspond to the quantum well layers of the heavy-hole quantum wells 54, 56, 58 or the light-hole quantum wells 60, 62. In the exemplary embodiment shown in FIG. 2, the semiconductor layers 42, 46, 50 correspond to the quantum well layers of both the electron quantum wells 64–68 and the heavy-hole quantum wells 54, 56, 58.

Figure 3A:
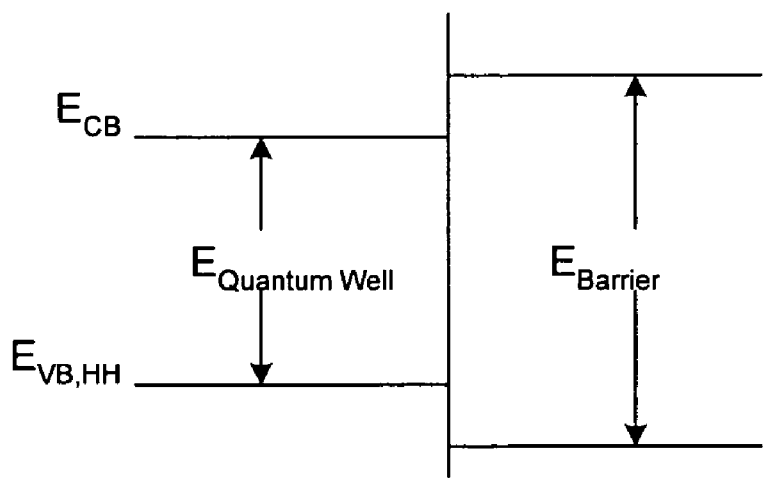
FIG. 3A is a heavy-hole energy-band diagram for a heterojunction exhibiting a Type I energy-band alignment.
Figure 3B:
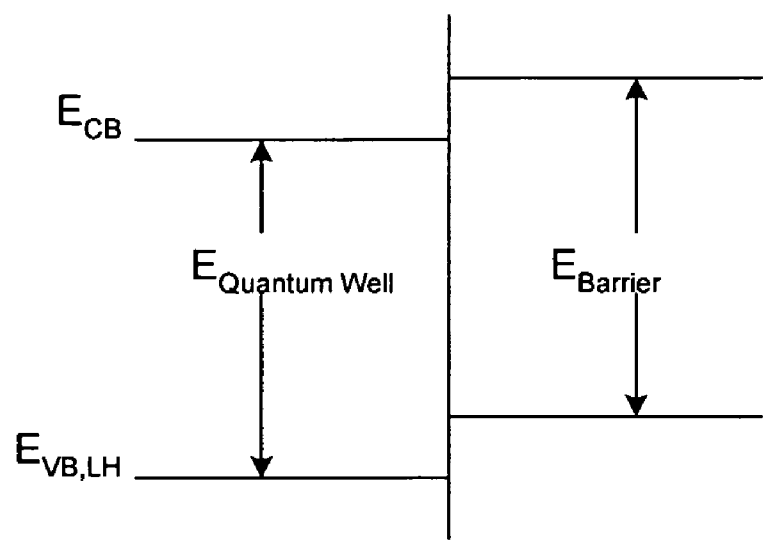
FIG. 3B is a light-hole energy-band diagram for a heterojunction exhibiting a Type II energy-band alignment.

Referring to FIGS. 2, 3A, and 3B, the material compositions of the semiconductor layers 40–52, as well as the level and types of strain introduced into the semiconductor layers 40–52, are selected so that heavy holes are confined to semiconductor layers 42, 46, 50 and light holes are confined to semiconductor layers 44, 48. To achieve this end, the valence energy-band alignments at heterojunctions formed between pairs of adjacent semiconductor layers form an interleaved series of quantum wells and barriers for heavy-holes and light-holes.

In the exemplary embodiment illustrated in FIG. 2, with respect to heavy-holes, the energy-band ($E_{CB}$–$E_{VB,HH}$) exhibits a Type I energy-band alignment at each heterojunction. As shown in FIG. 3A, in a Type I band alignment the energy levels of the valence-band edge and the conduction band edge of the quantum well layers lie between the energy levels of the valence-band edge and the conduction-band edge of the barrier layers. With respect to light holes, there are no bound states in the barrier layer. As shown in FIG. 3B, in a Type II band alignment the energy levels of the valence-band edge and the conduction-band edge of the quantum well layers lie below the respective energy levels of the valence-band edge and the conduction-band edge of the barrier layers. In this case, there are bound light-hole states in the barrier layer. The types of band alignments (e.g., Type I and Type II) that are needed to confine heavy holes and light holes in separate layers may differ depending on the composition of the semiconductor layers 40–52 and the type and level of strain in these layers. For example, in some implementations, heavy holes may be confined in layers exhibiting a Type II energy-band alignment and light holes may be confined in layers exhibiting a Type I energy-band alignment.

The resulting heavy-hole and light-hole energy-band diagrams are superposed in the energy-band diagram shown in FIG. 2. The wavefunctions ($\Phi_{HH}$) for heavy holes in the valence-band are largely confined to the heavy-hole quantum wells 54–58 formed in layers 42, 46, 50 and the wavefunctions for light-holes ($\Phi_{LH}$) in the valence-band are largely confined to the light-hole quantum wells 60–62 formed in layers 44, 48. The wavefunctions ($\Phi_E$) for electrons in the conduction band are largely confined to the electron quantum wells 64–68 formed in layers 42, 46, 50. The overlap in the electron and heavy-hole wavefunctions ($\Phi_E$, $\Phi_{HH}$) in the semiconductor layers 42, 46, 50 allows direct electron-to-heavy-hole (E-to-HH) transitions across the energy gap in semiconductor layers 42, 46, 50 (corresponding to a Type I band alignment). In addition, the significant penetration of the electron wavefunctions ($\Phi_E$) into semiconductor layers 44, 48, as well as the penetration of light-hole wavefunctions ($\Phi_{LH}$) into semiconductor layers 42, 46, 50, allows direct electron-to-light-hole (E-to-LH) transitions across the energy gap in semiconductor layers 44, 48.

In this way, the bound carriers in each of the series of adjacent quantum well layers 42–50 contribute to optical coupling. Thus, for a given thickness, the semiconductor quantum well structure 38 provides approximately twice the optical coupling strength of a comparable structure in which optical coupling occurs only in quantum wells separated by non-contributing barrier layers. This feature enables devices incorporating the semiconductor quantum well structure 38 to be made with an interaction length that is approximately one-half the interaction length of devices incorporating comparable structures in which optical coupling occurs only in quantum wells separated by non-contributing barrier layers, while providing the approximately same performance.

As shown in FIG. 2, in the illustrated embodiment, the first bound states 70, 72, 74 of the heavy-hole quantum wells 54–58 are at approximately the same energy level as the first bound states 76, 78 of the light-hole quantum wells 60, 62. In this way, the electron-to-heavy-hole optical transitions and the electron-to-light-hole optical transitions occur at approximately the same wavelength. The energy levels of the first heavy-hole and light-hole bound states 70–78, as well as the density of carrier states, may be designed so that the optical coupling strengths (in terms of, for example, absorption or gain) for TM mode light and TE mode light are approximately the same to achieve polarization independence. For example, in some implementations, the levels of TM mode optical absorption by the light-hole quantum wells 60, 62 is substantially equal in magnitude to the TE mode optical absorption by the heavy-hole quantum wells 54–58 for a target optical wavelength. In some of these implementations, polarization-independent operation is achieved by configuring the quantum well structure 38 so that the levels of TM mode optical absorption and TE mode optical absorption differ by at most 1 dB (deciBel) for the target optical wavelength.

In general, the semiconductor quantum well structure 38 may be formed of any semiconductor layers in which interleaved heavy-hole and light-hole valence-band quantum wells may be formed, where at least one layer that functions as a barrier layer of the light-hole quantum well also functions as a quantum well layer of the heavy-hole quantum well, and at least one layer that functions as a barrier layer of the heavy-hole quantum well also functions as a quantum well layer of the light-hole quantum well. In some implementations, each of the semiconductor layers 40–52 has a thickness in the range of about 5 nm to about 12 nm. Exemplary embodiment includes a series of alternating layers of different composition of a particular semiconductor family, including III–V and II–IV semiconductor material families, such as $In_xGa_{1-x}As_yP_{1-y}$ or $In_{1-x-y}Al_xGa_yAs$, where $0 \leq x \leq 1$ and $0 \leq y \leq 1$.

In some exemplary implementations, each of the semiconductor layers 40–52 is formed of $In_xGa_{1-x}As_yP_{1-y}$, where the value of y is the same for all layers 40–52 to achieve sharp and stable heterojunctions, and the value of x is greater for the heavy-hole and electron quantum well layers 42, 46, 50 than for the light-hole quantum well layers 44, 48. In one exemplary implementation of this type: x=0.76, y=0.75, the compressive strain is ~0.74%, and the layer thickness is approximately 8.5 nm for the heavy-hole and electron quantum well layers 42, 46, 50; and x=0.51, y=0.75, the tensile strain is ~–1%, and the layer thickness is approximately 8 nm for the light-hole quantum well layers 44, 48. With these parameters, the heavy holes are confined to layers 42, 46, 50 with a Type I energy-band alignment, and the light holes are confined to layers 44, 48 with a Type II energy-band alignment. The estimated transition energies for heavy holes and light holes in this structure are at 1471 nm and 1469 nm, respectively.

In other exemplary implementations, each of the semiconductor layers 40–52 is formed of $In_xGa_{1-x}As_yP_{1-y}$, where the value of y varies across the series of layers 40–52

FIG. 4 shows an embodiment of an electroabsorption modulator 80 that includes first and second electrodes 82, 84, first and second cladding regions 86, 88, and an active region 90 that incorporates the above-described semiconductor quantum well structure 38.

The first and second electrodes 82, 84 include one or more metal layers. In one exemplary embodiment, each of the first and second electrodes 82, 84 includes an underlying layer of titanium, which promotes adhesion and forms an ohmic contact interface between the electrodes 82, 84 and the supporting semiconductor material, and an overlying layer of gold that forms electrical contacts for the electroabsorption modulator 80. In the illustrated embodiment, the first electrode 82 is a traveling-wave signal electrode formed from a continuous strip of electrically conductive material, as shown in FIG. 5A, or from multiple spaced-apart electrode segments of electrically conductive material that are connected in series, with each pair of signal electrode segments connected by a respective inter-stage microstrip line 83, as shown in FIG. 5B.

In some implementations, the first and second electrodes 82, 84 are connected to input and output bonding pads by respective microstrip lines. The input bonding pad may be connected to an external signal source by a first bonding wire and the output bonding pad may be connected to an external termination load through a second bonding wire. The electro-absorption modulator 80, the input and output bonding pads, and the input and output microstrip lines are fabricated on the same substrate 92 (e.g., a wafer of semiconductor material, such as InP or GaAs). The external signal source may be any suitable high-frequency electrical signal source, including any RF (Radio Frequency) electrical signal source. The external termination load may be any suitable termination load, such as a resistor. The termination load and the signal source typically are impedance-matched to reduce reflections and maximize the electrical voltage that can be delivered across the active region 90 of the electroabsorption modulator 80.

In the illustrated embodiment, the substrate 92 may be electrically conducting (e.g., an n+ doped InP substrate) or electrically insulating. The electroabsorption modulator 80 and first and second metal film transmission lines 94, 96 are formed on an electrically conducting semiconductor layer 98 (e.g., n++ InGaAs or n++ InGaAsP), which is formed on the substrate 92.

In the illustrated embodiment, the first cladding region 86 is doped p-type, the second cladding region 88 is doped n-type, and the active region 90 is undoped and, therefore, contains relatively small amounts of impurities (e.g., less than about $5 \times 10^{15}$ cm$^{-3}$). The first and second cladding regions 86, 88 are formed of material compositions that have lower refractive indices than the material composition of the active region 90. In this way, the active region 90 operates as a waveguide for light traveling through the electroabsorption modulator 80. The active region 90 includes a light absorption region that includes the semiconductor quantum well structure 38. A p+-type cap (or contact) layer 100 is interposed between the p-type cladding layer 86 and the signal electrode 82.

Figure 6:
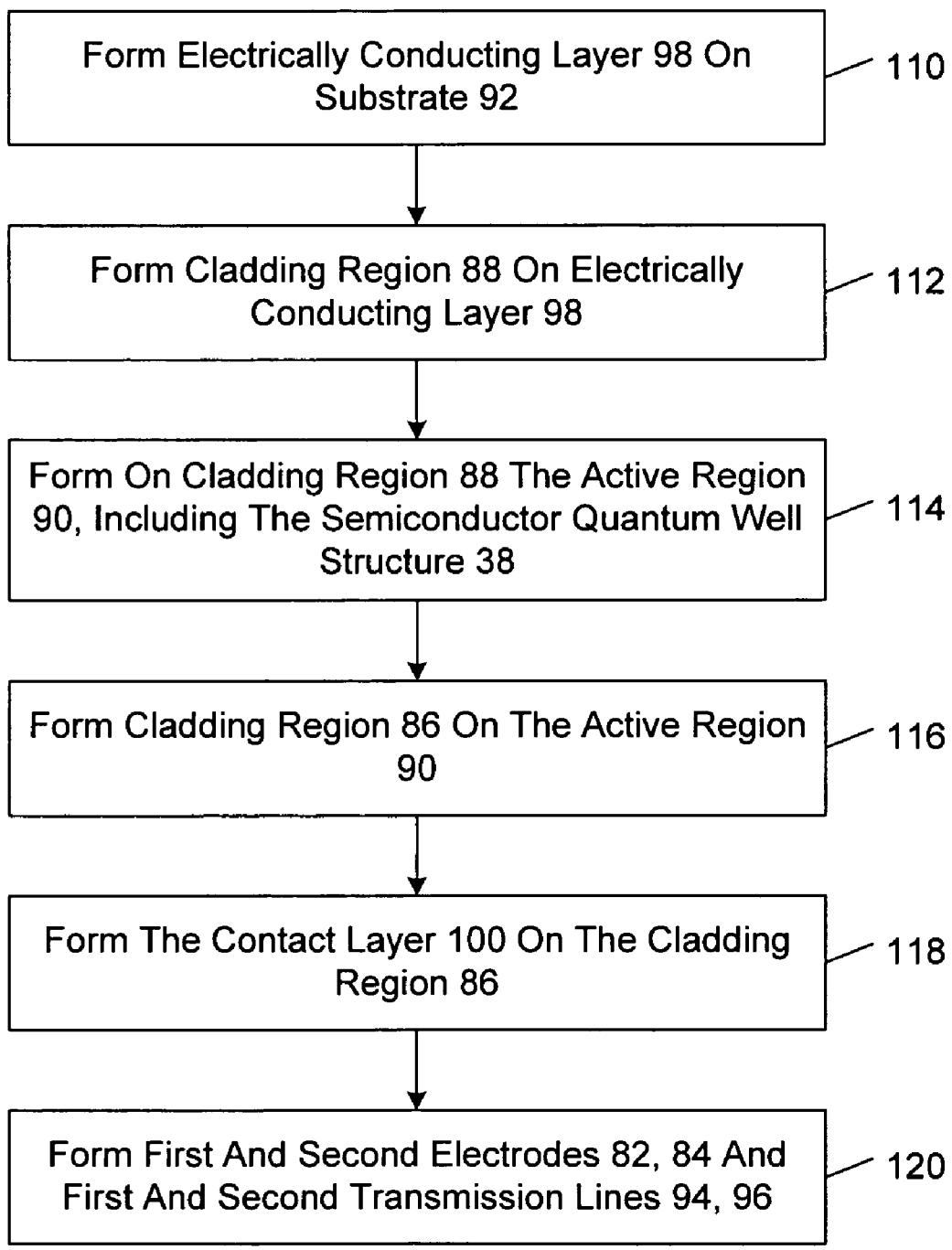
FIG. 6 is a flow diagram of an embodiment of a method of making the electroabsorption modulator embodiment of FIG. 4.

FIG. 6 shows an embodiment of a method of making the electroabsorption modulator 80. In accordance with this method, the electrically conducting layer 98 is formed on substrate 92 (block 110). The cladding region 88 is formed on the electrically conducting layer 98 (block 112). The active region 90, including the semiconductor quantum well structure 38, is formed on the cladding region 88 (block 114). The cladding region 86 is formed on the active region 90 (block 116). The contact layer 100 is formed on the cladding region 86 (block 118). The first and second electrodes 82, 84 are formed on the contact layer 100 and the backside of the substrate, and the first and second transmission lines 94, 96 are formed on the electrically conducting layer 98 (block 120).

Other embodiments are within the scope of the claims.

For example, in addition to electroabsorption modulators, the semiconductor quantum well structure 38 may be incorporated into any one of the following types of optoelectronic devices: electroabsorption modulated lasers, detectors, wave-guides, and in-line optical amplifiers.

What is claimed is:

1. A device, comprising:
    a quantum well structure comprising semiconductor layers defining interleaved heavy-hole and light-hole valance band quantum wells, each of the quantum wells comprising a quantum well layer interposed between barrier layers, wherein one of the semiconductor layers functioning as a barrier layer of one of the light-hole quantum wells also functions as the quantum well layer of one of the heavy-hole quantum wells, and another of the semiconductor layers functioning as a barrier layer of one of the heavy-hole quantum wells also functions as the quantum well layer of one of the light-hole quantum wells.

2. The device of claim 1, wherein ones of the semiconductor layers function as barrier layers and quantum well layers for conduction band electrons.

3. The device of claim 2, wherein the semiconductor layer functioning as the quantum well layer for the conduction band electrons also functions as the quantum well layer for the heavy-holes.

4. The device of claim 3, wherein direct electron-to-heavy-hole transitions occur across a Type I energy-band alignment, and direct electron-to-light-hole transitions occur across a Type II energy-band alignment.

5. The device of claim 2, wherein ones of the semiconductor layers functioning as the barrier layers for the conduction band electrons also function as the quantum well layers for the light holes.

6. The device of claim 1, wherein the semiconductor layer functioning as the quantum well layer for the light hole quantum well is under a first type of strain, and the semiconductor layer functioning as the quantum well layer of the heavy hole quantum well is under a second type of strain different from the first type of strain.

7. The device of claim 6, wherein the semiconductor layers includes alternating layers of different $In_xGa_{1-x}As_yP_{1-y}$ composition, where $0 \leq x \leq 1$ and $0 \leq y \leq 1$.

8. The device of claim 7, wherein y has a substantially constant value in the alternating layers.

9. The device of claim 7, wherein y has a value that varies across the alternating layers.

10. The device of claim 7, wherein the layer functioning as the quantum well layer of the light-hole quantum well is under tensile strain, and the layer functioning as the quantum well layer of the heavy-hole quantum well is under compressive strain.

11. The device of claim 6, wherein the semiconductor layers includes alternating layers of different $In_{1-x-y}Al_xGa_yAs$ composition, where $0 \leq x \leq 1$ and $0 \leq y \leq 1$.

12. The device of claim 1, wherein each of the light-hole and heavy-hole quantum wells has a respective lowest band state at substantially equal relative energy levels.

13. The device of claim 1, wherein TM mode optical absorption by the light-hole quantum well is substantially equal in magnitude to TE mode optical absorption by the heavy-hole quantum well for a target optical wavelength.

14. The device of claim 13, wherein levels of TM mode optical absorption and TE mode optical absorption differ by at most 1 dB (decibel) for the target optical wavelength.

15. The device of claim 1, wherein each of the semiconductor layers has a respective thickness ranging from about 5 nm to about 12 nm.

16. The device of claim 1, further comprising:
    first and second electrodes;
    first and second cladding regions disposed between the first and second electrodes; and
    an active region disposed between the first and second cladding regions and including the semiconductor quantum well structures.

17. The device of claim 16 wherein the semiconductor quantum well structure is incorporated in a light absorption region configured to absorb light traveling therethrough in an amount responsive to an electrical signal applied across the first and second electrodes.

18. A method of making a device, comprising:
    forming a quantum well structure comprising semiconductor layers defining interleaved heavy-hole and light-hole valance band quantum wells, each of the quantum wells comprising a quantum well layer interposed between barrier layers, wherein one of the semiconductor layers functioning as a barrier layer of one of the light-hole quantum well layers also functions as the quantum well layer of one of the heavy-hole quantum wells, and another of the semiconductor layers functioning as a barrier layer of one of the heavy-hole quantum wells also functions as the quantum well layer of one of the light-hole quantum wells.

19. The method of claim 18, wherein ones of the semiconductor layers function as barrier layers and quantum well layers for a conduction band electron quantum well.

20. The method of claim 18, further comprising introducing a first type of strain into the semiconductor layer functioning as the quantum well layer of the light hole quantum well, and introducing a second type of strain different from the first type of strain into the semiconductor layer functioning as the quantum well layer of the heavy hole quantum well.

21. The method of claim 18, further comprising:
forming first and second electrodes;
forming first and second cladding regions disposed between the first and second electrodes; and
forming an active region disposed between the first and second cladding regions and including the semiconductor quantum well structures.

* * * * *